US012581951B2

(12) United States Patent (10) Patent No.: US 12,581,951 B2
Nagai (45) Date of Patent: Mar. 17, 2026

(54) SEMICONDUCTOR MODULE HAVING A PLURALITY OF HEAT SINK PLATES

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventor: Shohei Nagai, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 405 days.

(21) Appl. No.: 17/678,240

(22) Filed: Feb. 23, 2022

(65) Prior Publication Data

US 2022/0285245 A1 Sep. 8, 2022

(30) Foreign Application Priority Data

Mar. 8, 2021 (JP) ................................. 2021-036074

(51) Int. Cl.
*H01L 23/427* (2006.01)
*H01L 23/367* (2006.01)

(52) U.S. Cl.
CPC ........ *H01L 23/4275* (2013.01); *H01L 23/367* (2013.01)

(58) Field of Classification Search
CPC ......... H01L 23/28; H01L 23/34; H01L 23/36; H01L 23/367; H01L 23/373; H01L 23/427; H01L 23/4275; H01L 23/3733; H01L 23/3736; H01L 23/3672
See application file for complete search history.

(56) References Cited

U.S. PATENT DOCUMENTS

| | | | | |
|---|---|---|---|---|
| 6,535,388 B1 * | 3/2003 | Garcia | .................... | H01L 23/36 174/16.3 |
| 7,355,852 B2 * | 4/2008 | Pfahnl | .................... | G06Q 20/20 174/15.1 |
| 7,484,552 B2 * | 2/2009 | Pfahnl | .................... | F28D 1/0535 165/80.4 |
| 7,608,918 B2 * | 10/2009 | Kanazawa | .............. | H01L 25/16 257/777 |
| 10,229,895 B2 | 3/2019 | Gottwald et al. | | |
| 2005/0133212 A1 * | 6/2005 | Wilson | .................... | F28F 3/086 257/E23.098 |
| 2008/0258294 A1 * | 10/2008 | Tseng | ...................... | H01L 25/03 257/E23.101 |

(Continued)

FOREIGN PATENT DOCUMENTS

| | | |
|---|---|---|
| JP | 2001-308470 A | 11/2001 |
| JP | 2012-038892 A | 2/2012 |

(Continued)

*Primary Examiner* — Wael M Fahmy
*Assistant Examiner* — Tiberiu Dan Onuta
(74) *Attorney, Agent, or Firm* — Posz Law Group, PLC

(57) ABSTRACT

A semiconductor module includes a substrate, a semiconductor element and a heat sink plate. The substrate is included in a circuit board. The semiconductor element is disposed at the heat sink plate inside the substrate. A fluid is sealed inside the heat sink plate.

13 Claims, 5 Drawing Sheets

(56)  References Cited

U.S. PATENT DOCUMENTS

| | | | | |
|---|---|---|---|---|
| 2012/0241942 A1* | 9/2012 | Ihara | ........................ | H01L 24/83 |
| | | | | 438/122 |
| 2018/0158756 A1 | 6/2018 | Smoot et al. | | |
| 2018/0233427 A1* | 8/2018 | Shih | ........................ | F28F 21/02 |
| 2018/0342438 A1* | 11/2018 | Chen | ................. | H01L 23/49568 |
| 2019/0378779 A1* | 12/2019 | Fujii | .................... | H01L 23/498 |
| 2020/0350229 A1* | 11/2020 | Chang | ................ | H05K 7/20309 |
| 2020/0403384 A1* | 12/2020 | Gubbins | ............ | H04Q 11/0003 |

FOREIGN PATENT DOCUMENTS

| | | | | |
|---|---|---|---|---|
| JP | 2013-131603 A | 7/2013 | | |
| WO | WO-0190867 A1 * | 11/2001 | ............ | F28D 1/053 |

* cited by examiner

SEMICONDUCTOR MODULE HAVING A PLURALITY OF HEAT SINK PLATES

CROSS REFERENCE TO RELATED APPLICATION

This application is based on Japanese Patent Application No. 2021-036074 filed on Mar. 8, 2021, the disclosure of which is incorporated herein by reference.

TECHNICAL FIELD

The present disclosure relates to a semiconductor module.

BACKGROUND

A semiconductor module may include a substrate and a semiconductor element located inside a substrate.

SUMMARY

The present disclosure describes a semiconductor module including a substrate, a semiconductor element and a heat sink plate.

BRIEF DESCRIPTION OF THE DRAWINGS

The objects, features and advantages of the present disclosure will become more apparent from the following detailed description made with reference to the accompanying drawings. In the drawings.

DETAILED DESCRIPTION

Figure 1:
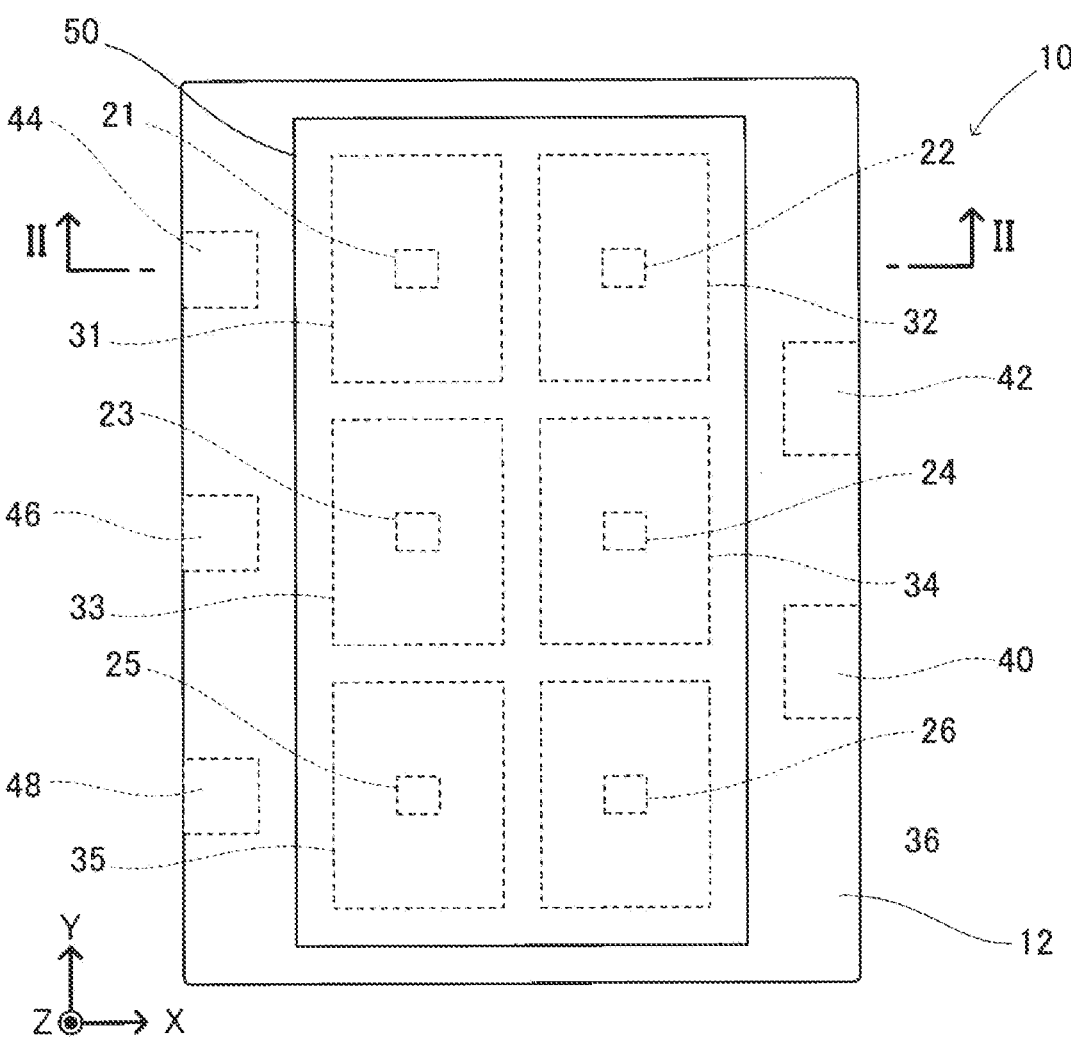
FIG. 1 is a plan view of a semiconductor module in an embodiment.

A semiconductor element included in a semiconductor module may be a power semiconductor element, and may generate a large amount of heat along with an electrical conduction.

In the structure in which a semiconductor element, in particular, a power semiconductor element is arranged in a substrate of a semiconductor device, it may be difficult to dissipate the heat generated by the semiconductor element to outside so that an excessive increase in the temperature of the semiconductor element may occur.

According to an aspect of the present disclosure, a semiconductor module includes a substrate, a semiconductor element and a heat sink plate. The substrate is included in a circuit board. The semiconductor element is disposed at the heat sink plate inside the substrate. A fluid is sealed inside the heat sink plate.

By adopting a structure in which the fluid is sealed inside the heat sink plate, for example, it is possible to enhance the thermal conduction of the heat sink plate and to provide anisotropy to the thermal conduction of the heat sink plate. As a result, it is possible to diffuse the heat generated by the semiconductor element in a wider range of the substrate through the heat sink plate, and it is possible to effectively suppress an increase in the temperature of the semiconductor element.

In a semiconductor module according to the following embodiment of the present description, the thermal conductivity of a heat sink plate may have anisotropy in a plan view. According to such a structure, it is possible to effectively diffuse the heat generated by a semiconductor element according to the shape of the heat sink plate or the shape of a substrate.

In the following embodiment of the present description, the heat sink plate may have a rectangular outer shape. In this situation, the thermal conductivity in the longitudinal direction of the heat sink plate may be higher than the thermal conductivity in the lateral direction of the heat sink plate. According to such a structure, it is possible to evenly diffuse the heat generated by the semiconductor element over the tire heat sink plate.

In the following embodiment of the present description, it is possible to further include multiple terminals that are exposed to the surface of the substrate and electrically connected to the semiconductor element. In this situation, the multiple terminals may be disposed to face the heat sink plate in the lateral direction of the heat sink plate. According to such a structure, it is possible to shorten the current path connecting the multiple terminals and the semiconductor element to reduce the impedance of the current path. As the impedance of the current path is reduced, the heat generation in the current path is suppressed so that the temperature rise in the semiconductor element is also suppressed.

In the following embodiment of the present description, the heat sink plate may be a heat pipe or a vapor chamber. The heat pipe and the vapor chamber are examples of the heat transfer member in which the fluid is enclosed, and such a heat transfer member can be suitably adopted for the heat sink plate described in the present description.

In the following embodiment of the present description, the heat sink plate may be made of metal or graphite. The metal and graphite are materials having excellent thermal conductivity, and such heat transfer members can be suitably adopted for the heat sink plate described in the present description.

In the following embodiment of the present description, a semiconductor module may further include a control circuit that controls the operation of the semiconductor element. According to such a structure, it is possible to suppress the temperature rise in the semiconductor element. Therefore, it is possible to avoid a situation in which the control circuit is overheated, when the control circuit is disposed at the surface of the substrate.

According to another aspect of the present description, it is possible to reduce the impedance of the current path in the semiconductor module having a built-in semiconductor element. In the following embodiment of the present description, the semiconductor module may include a substrate, a semiconductor element, a heat sink plate, and multiple terminals. The semiconductor element is disposed in the substrate. The heat sink plate is provided with the semiconductor element inside the substrate. The multiple terminals are exposed to the surface of the substrate, and are electrically connected to the semiconductor element inside the substrate.

In the following embodiment of the present description, the heat sink plate may have a rectangular outer shape. In this situation, the multiple terminals may be disposed in the lateral direction of the heat sink plate with respect to the heat sink plate. According to such a structure, it is possible to shorten the current path connecting the multiple terminals and the semiconductor element to reduce the impedance of the current path.

In the following embodiment, at least one of the multiple terminals is located at one side of the heat sink plate to face the heat sink plate in the lateral direction, and at least another one of the multiple terminals is located at the other side of the heat sink plate to face the heat sink plate in the lateral direction of the heat sink plate. According to such a structure, it is possible to effectively shorten the current path connecting the multiple terminals and the semiconductor element to further reduce the impedance of the current path.

Embodiment

The following describes a semiconductor module 10 according to the embodiment with reference to the drawings. The semiconductor module 10 according to the present embodiment is adopted, for example, in a power control unit in an electric vehicle, and can convert power between a power supply and a drive motor. The electric vehicle in the present embodiment broadly means a vehicle having a motor for driving wheels, and for example, an electric vehicle charged by an external electric power, a hybrid vehicle having an engine in addition to the motor, a fuel cell vehicle having a fuel cell as the power source and the like. However, the application of the semiconductor module 10 according to the present embodiment may not be limited to the electric vehicle, and may be applied to a variety of electrical apparatuses.

Figure 2:
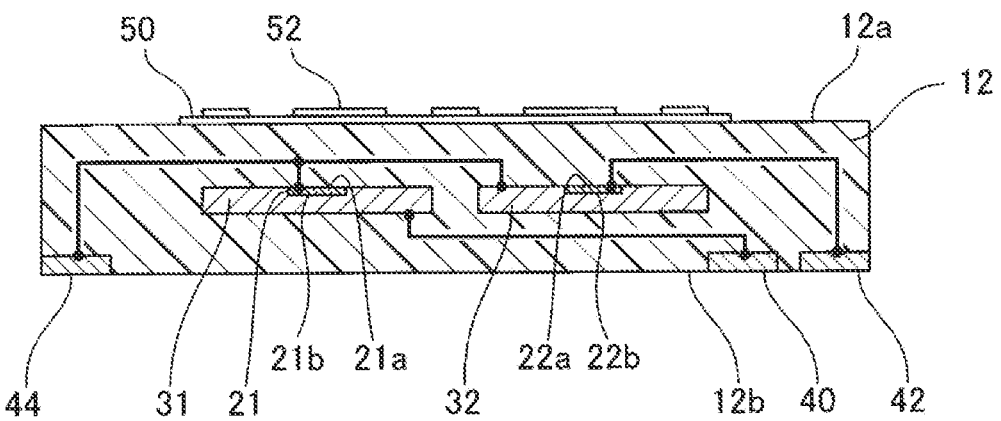
FIG. 2 is a cross-sectional view taken along the line II-II in FIG. 1.
Figure 3:
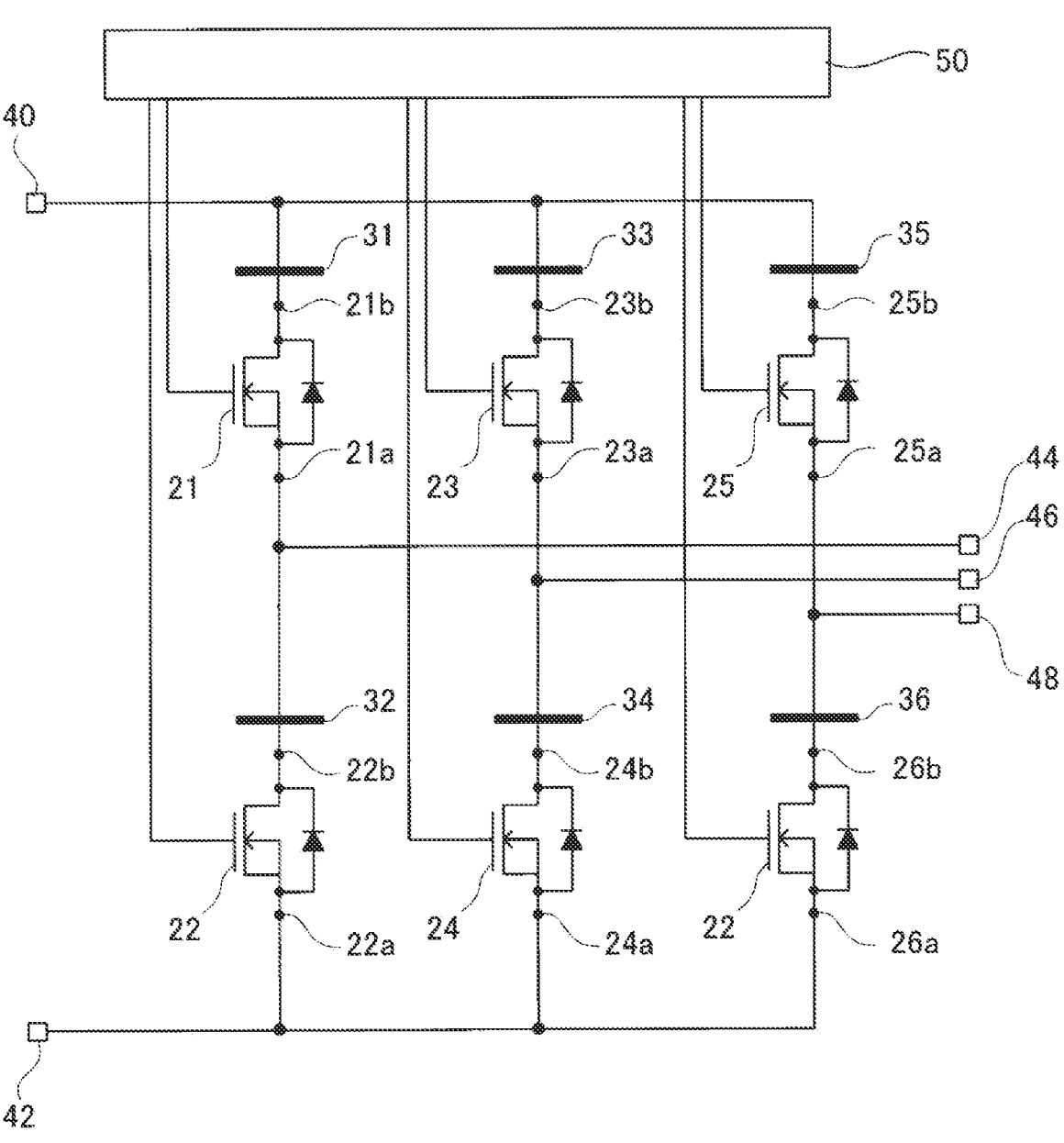
FIG. 3 is a circuitry diagram that illustrates the circuitry configuration of the semiconductor module in the embodiment.

As illustrated in FIGS. 1 to 3, the semiconductor module 10 includes a substrate 12, multiple semiconductor elements 21 to 26 and multiple heat sink plates 31 to 36. The substrate 12 may also be referred to as a substrate main body or a substrate body. The substrate 12 has a boarded shape or a plate-like shape. The substrate 12 has an upper surface 12a and a lower surface 12b. The lower surface 12b is located at a side opposite to the upper surface 12a. The substrate 12 is made of an insulator, for example, an epoxy resin or other resin material.

X-direction and Y-direction in the drawings are directions parallel to the upper surface 12a and the lower surface 12b of the substrate 12, and are directions perpendicular to each other. Z-direction is a direction perpendicular to the upper surface 12a and the lower surface 12b of the substrate 12, and is a direction perpendicular to each of the X-direction and the Y-direction.

Semiconductor elements 21 to 26 are located inside the substrate 12, and are sealed by the substrate 12. Each of the semiconductor elements 21 and 22 is a power semiconductor element, and in particular, a switching element. This switching element may be, for example, an Insulated Gate Bipolar Transistor (IGBT) or a Metal-Oxide-Semiconductor Field-Effect Transistor (MOSFET). The semiconductor elements 21 to 26 respectively have upper surface electrodes 21a to 26a and lower surface electrodes 21b to 26b, and respectively conduct electricity or block an electrical conduction between the corresponding upper surface electrodes 21a to 26a and the corresponding lower surface electrodes 21b to 26b.

As an example, in the semiconductor module 10 in the present embodiment, the multiple semiconductor elements 21 to 26 are respectively referred to as a first semiconductor element 21, a second semiconductor element 22, a third semiconductor element 23, a fourth semiconductor element 24, a fifth semiconductor element 25 and a sixth semiconductor element 26. The first semiconductor element 21 and the second semiconductor element 22 are electrically connected in series inside the substrate 12. The third semiconductor element 23 and the fourth semiconductor element 24 are electrically connected in series inside the substrate 12. The fifth semiconductor element 25 and the sixth semiconductor element 26 are electrically connected in series inside the substrate 12.

Heat sink plates 31 to 36 are located inside the substrate 12, and are sealed by the substrate 12. Each of the heat sink plates 31 to 36 includes a boarded shape or a plate-like shape, and is arranged on the same plane parallel to the substrate 12. In other words, each of the heat sink plates 31 to 36 is perpendicular to the Z-direction. Each of the heat sink plates 31 to 36 includes a conductor such as copper, a metal other than copper, or graphite. The structure of each of the heat sink plates 31 to 36 is described in the following.

As an example, the heat sink plates 31 to 36 in the semiconductor module 10 according to the present embodiment are respectively referred to as a first heat sink plate 31, a second heat sink plate 32, a third heat sink plate 33, a fourth heat sink plate 34, a fifth heat sink plate and a sixth sink plate 36. The first heat sink plate 31 and the second heat sink plate 32 are aligned along the X-direction. The third heat sink plate 33 and the fourth heat sink plate 34 are aligned along the X-direction. The fifth heat sink plate 35 and the sixth heat sink plate 36 are aligned along the X-direction. The first heat sink plate 31, the third heat sink plate 33 and the fifth heat sink plate 35 are aligned along the Y-direction. The second heat sink plate 32, the fourth heat sink plate 34 and the sixth heat sink plate 36 are aligned along the Y-direction.

The first semiconductor element 21 is arranged at the first heat sink plate 31, and the lower surface electrode 21b of the first semiconductor element 21 is electrically connected to the first heat sink plate 31. The second semiconductor element 22 to the sixth semiconductor elements 26 are respectively disposed at the second heat sink plate 32 to the sixth heat sink plate 36. The lower surface electrodes 22b to 26b respectively included in the second semiconductor element 22 to the sixth semiconductor element 26 are correspondingly electrically connected to the second heat sink plate 32 to the sixth heat sink plate 36.

The semiconductor module 10 includes terminals 40, 42, 44, 46, 48. These terminals 40, 42, 44, 46, 48 are external connection terminals for connecting to an external circuit. The terminals 40, 42, 44, 46, 48 are made of a conductor such as copper or other metal. As an example, the terminals 40, 42, 44, 46, 48 are respectively referred to as a P terminal 40, an N terminal 42, a U terminal 44, a V terminal 46 and a W terminal 48. The P terminal 40 and the N terminal 42 are located to face one side of each of the heat sink plates 31 to 36 in the X direction. The U terminal 44, the V terminal 46 and the W terminal 48 are located to face the other side of each of the heat sink plates 31 to 36 in the X direction. The terminals 40, 42, 44, 46, 48 are disposed at the lower surface 12b of the substrate 12. However, one or more of the terminals 40, 42, 44, 46, 48 may be disposed at the upper surface 12a of the substrate 12.

The P terminal 40 is electrically connected to the first heat sink plate 31, the third heat sink plate 33 and the fifth heat sink plate 35 inside the substrate 12. As a result, the P terminal 40 is electrically connected to the respective lower surface electrodes 21b, 23b, 25b of the first semiconductor element 21, the third semiconductor element 23 and the fifth semiconductor element 25 through one of the heat sink plates 31, 33, 35. The N terminal 42 is electrically connected to the respective upper surface electrodes 22a, 24a, 26a of the second semiconductor element 22, the fourth semiconductor element 24 and the sixth semiconductor element 26 inside the substrate 12.

The U terminal 44 is electrically connected to the upper surface electrode 21a of the first semiconductor element 21 inside the substrate 12. The U terminal 44 is electrically connected to the second heat sink plate 32, and is electrically connected to the lower surface electrode 22b of the second semiconductor element 22 through the second heat sink plate 32. The V terminal 46 is electrically connected to the upper surface electrode 23a of the third semiconductor element 23 and the fourth heat sink plate 34, and is electrically connected to the lower surface electrode 24b of the fourth semiconductor element 24 through the fourth heat sink plate 34. The W terminal 48 is electrically connected to the upper surface electrode 25a of the fifth semiconductor element 25 and the sixth heat sink plate 36, and is electrically connected to the lower surface electrode 26b of the sixth semiconductor element 26 through the sixth heat sink plate 36.

The semiconductor module 10 in the present embodiment is arranged between a direct current (DC) circuit and a three-phase alternating current (AC) circuit, and can function as a three-phase inverter circuit. In this situation, the P terminal 40 and the N terminal 42 are connected to the DC circuit, and the U terminal 44, the V terminal 46 and the W terminal 48 are connected to the three-phase AC circuit. As the semiconductor elements 21 to 26 are selectively turned on and turned off, each of the U terminal 44, the V terminal 46 and the W terminal 48 is electrically connected to either the P terminal 40 or the N terminal 42. As a result, the semiconductor module 10 converts DC power from the DC circuit into AC power and supplies the AC power to the three-phase AC circuit, or converts the AC power from the three-phase AC circuit into the DC power and supplies the DC power to the DC circuit. As described above, the semiconductor module 10 in the present embodiment may be adopted, for example, in an electric vehicle. In this situation, the semiconductor module 10 is arranged between a power supply device as the DC circuit and the drive motor as the three-phase AC circuit, and executes power conversion between the power supply device and the drive motor.

The semiconductor module 10 further includes a control circuit 50. The control circuit 50 is disposed at the upper surface 12a of the substrate 12. The control circuit 50 includes multiple surface electrical components 52. The surface electric components 52 include, for example, a gate drive circuit that controls switching of the semiconductor elements 21 to 26. As described above, the semiconductor module 10 in the present embodiment includes a structure in which the semiconductor elements 21 to 26 and the heat sink plates 31 to 36 are incorporated in a circuit board having the control circuit 50. The number of the semiconductor elements 21 to 26 and the number of the heat sink plates 31 to 36 are not particularly limited. The semiconductor module 10 may include at least one semiconductor element and at least one heat sink plate. In this case, the semiconductor element is not limited to the switching element, and may be another type of semiconductor element such as a diode.

Figure 4:
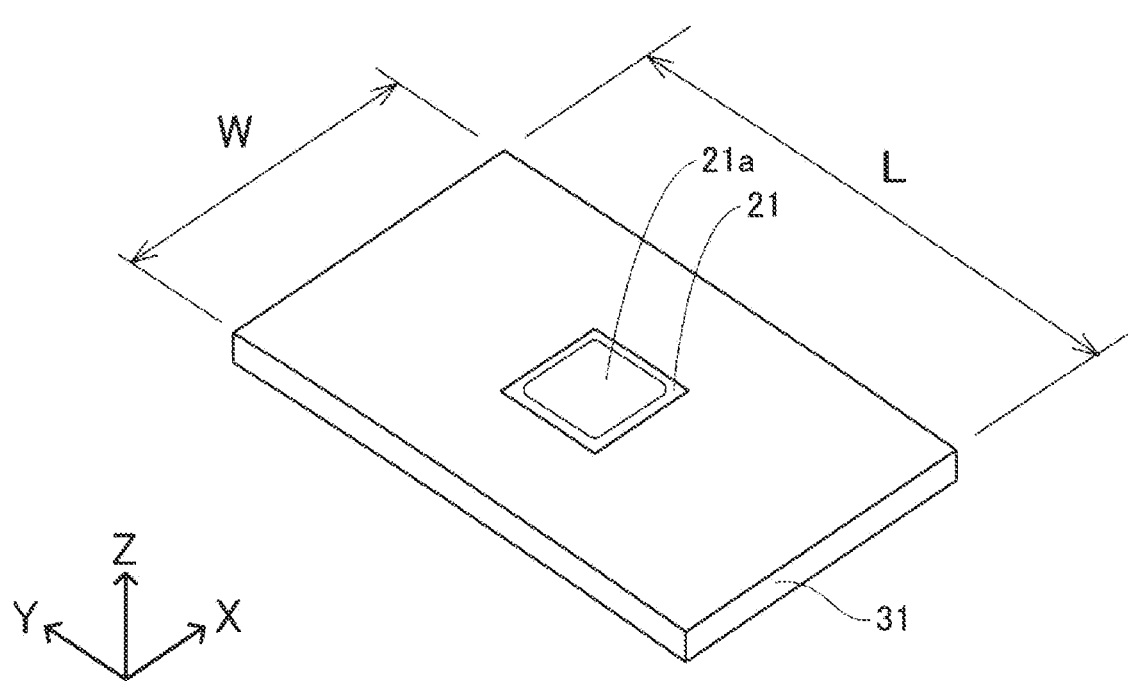
FIG. 4 is a perspective view of a heat sink plate.
Figure 5A:
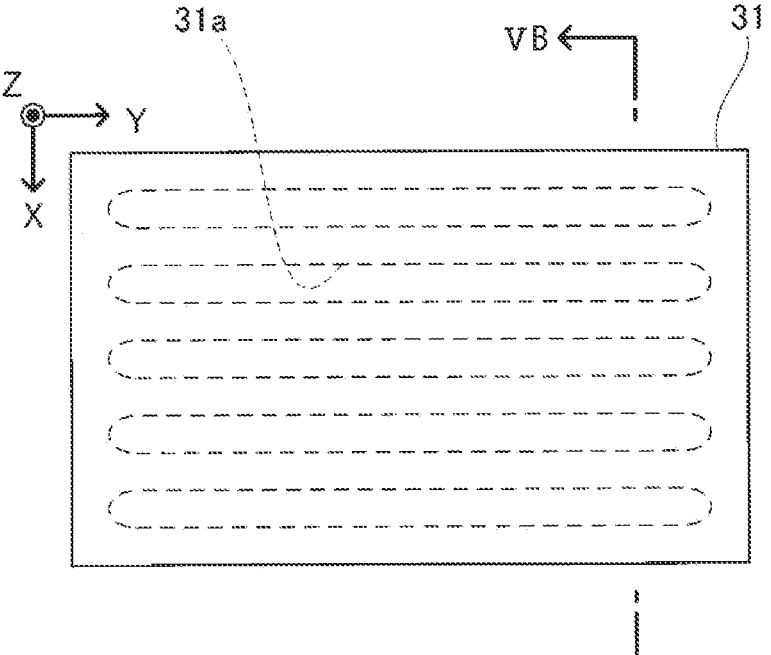
FIG. 5A is a plan view of the heat sink plate.
Figure 5B:
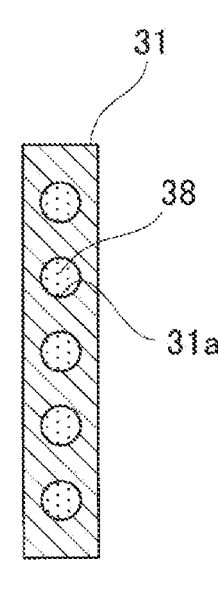
FIG. 5B is a cross-sectional view of the heat sink plate taken along the line VB-VB in FIG. 5A.

The following describes the heat sink plates 31 to 36 with reference to FIGS. 4, 5A, 5B. The heat sink plates 31 to 36 in the present embodiment respectively have identical structures. Therefore, each of FIGS. 4, 5A, 5B illustrates only the first heat sink plate 31, and omits the illustration of other heat sink plates 32 to 36. However, some or all of the heat sink plates 31 to 36 may have different structures.

As illustrated in FIG. 4, the heat sink plates 31 to 36 respectively have rectangular outer shapes. The longitudinal direction of each of the heat sink plates 31 to 36 is parallel to the Y-direction, and the lateral direction of each of the heat sink plates 31 to 36 is parallel to the X-direction. In the semiconductor module according to the present embodiment, the terminals 40, 42, 44, 46, 48 are arranged to face the heat sink plates 31 to 36 in the X-direction. In other words, the terminals 40, 42, 44, 46, 48 are disposed to face the heat sink plates 31 to 36 in the lateral direction of the heat sink plates 31 to 36. According to such a structure, it is possible to enlarge the size of each of the heat sink plates 31 to 36 while shortening the distance between each of the terminals 40, 42, 44, 46, 48 and each of the heat sink plates 31 to 36.

As the size of each of the heat sink plates 31 to 36 increases, the heat generated by the semiconductor elements 21 to 26 is diffused over a wider range in the substrate 12. As a result, the temperature rise in the semiconductor elements 21 to 26 is effectively suppressed. As the distance between each of the terminals 40, 42, 44, 46, 48 and each of the heat sink plates 31 to 36 decreases, it is possible to shorten the current path through which the current flows in the substrate 12, and it is possible to reduce the impedance in the current path. By enlarging each of the heat sink plates 31 to 36 so as to have a rectangular shape in one direction and disposing the terminals 40, 42, 44, 46, 48 in the lateral direction of the rectangular shape, it is possible to enhance the cooling performance and reduce the impedance.

As illustrated in FIG. 5B, multiple rooms 31a are formed inside the heat sink 31 in a cross sectional view of the heat sink plate 31 taken along the line VB-VB in FIG. 5A, and a fluid 38 is sealed inside each of the rooms 31a in a cross sectional view of the heat sink plate 31 taken along the line VB-VB in FIG. 5A. The fluid 38 is heated and vaporized in a high temperature part of each of the heat sink plates 31 to 36. The fluid 38 condenses and liquefies in a low temperature portion of each of the heat sink plates 31 to 36. By repeating the above described cycle, the convection of the fluid 38 is formed in the room 31a, and the thermal conduction in each of the heat sink plates 31 to 36 is enhanced. As a result, the heat generated in each of the semiconductor elements 21 to 26 is diffused over a wider range in the substrate 12, and the temperature rise in each of the semiconductor elements 21 to 26 is effectively suppressed.

Although not particularly limited, each of the heat sink plates 31 to 36 in the present embodiment has a so-called heat pipe structure. Each of the rooms 31a inside the heat sink plates 31 to 36 extends in a pipe shape, and the fluid 38 in each of the rooms 31a convects along a longitudinal direction of the pipe shape. In other words, the fluid 38 convects along the longitudinal direction (Y direction) of each of the heat sink plates 31 to 36. Each of the rooms 31a having a pipe shape extends along the longitudinal direction of each of the heat sink plates 31 to 36. Therefore, the thermal conductivity of each of the heat sink plates 31 to 36 has anisotropy in a plan view. The thermal conductivity in the longitudinal direction or a longer side of each of the heat sink plates 31 to 36 is higher than the thermal conductivity in the lateral direction or a shorter side of each of the heat sink plates 31 to 36. According to such a structure, in each of the rectangular heat sink plate 31 to 36, it is possible to evenly diffuse the heat generated by each of the semiconductor elements 21 to 26 to each of the entire heat sink plates 31 to 36.

Figure 6A:
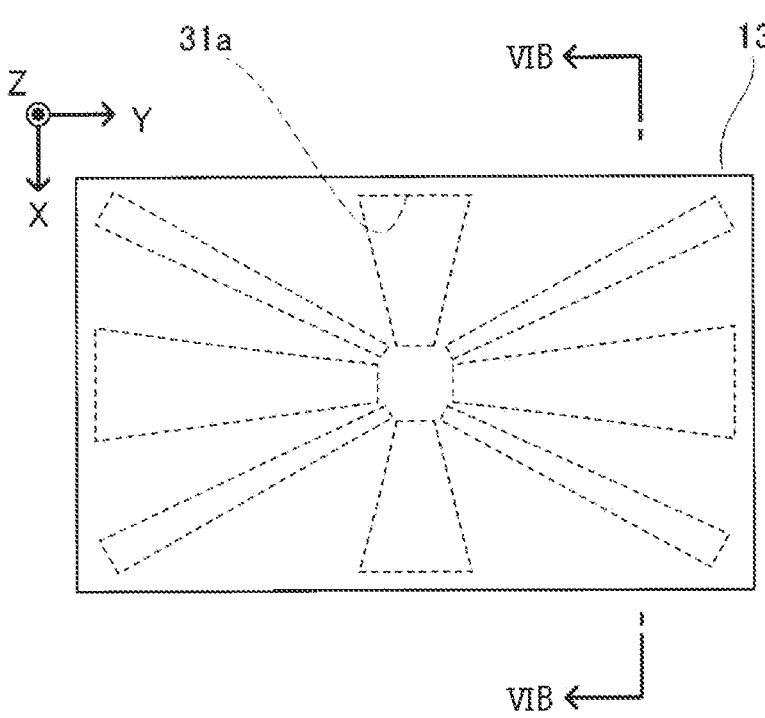
FIG. 6A is a plan view of a heat sink plate according to a first modification.
Figure 6B:
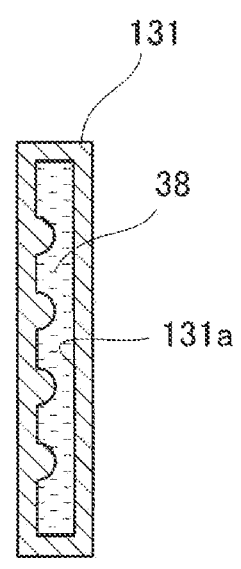
FIG. 6B is a cross-sectional view of the heat sink plate taken along the line VIB-VIB in FIG. 6A.

Each of FIGS. 6A, 6B illustrates a heat sink plate 131 according to a first modification. The heat sink plate 131 may be adopted for any of the first heat sink plate 31 to the sixth heat sink plate 36 in the semiconductor module 10. The heat sink plate 131 according to the first modification has a so-called heat spreader structure, as illustrated in FIG. 6A. Therefore, as illustrated in FIG. 6B, a room 131*a* is formed inside the heat sink plate 131 in a cross sectional view of the heat sink plate 131 taken along the line VIB-VIB in FIG. 6A, and the fluid 38 is sealed inside the room 131*a* in a cross sectional view of the heat sink plate 131 taken along the line VIB-VIB in FIG. 6A. Even with such a structure, it is possible to provide anisotropy to the thermal conductivity of the heat sink plate 131. In this situation, the thermal conductivity in the longitudinal direction or a longer side of each of the heat sink plates 31 to 36 is higher than the thermal conductivity in the lateral direction or a shorter side of each of the heat sink plates 31 to 36.

Figure 7A:
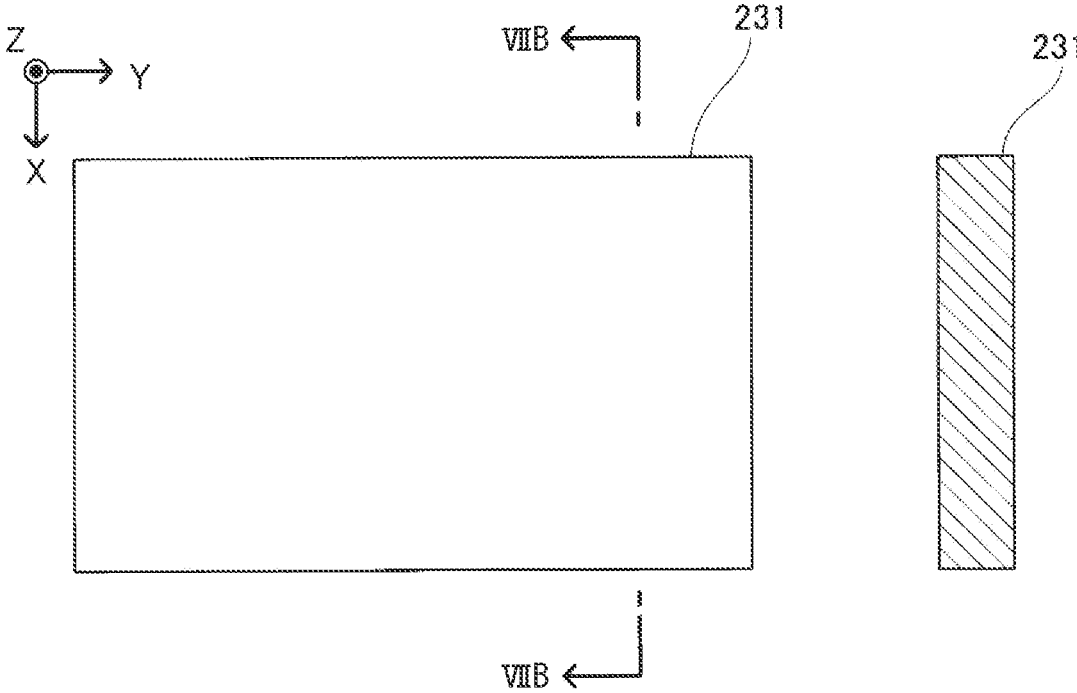
FIG. 7A is a plan view of a heat sink plate according to a second modification.
Figure 7B:
FIG. 7B is a cross-sectional view of the heat sink plate taken along the line VIIB-VIIB in FIG. 7A.

Each of FIGS. 7A, 7B illustrates a heat sink plate 231 according to a second modification. The heat sink plate 231 may be adopted for any of the first heat sink plate 31 to the sixth heat sink plate 36 in the above described semiconductor module 10. As illustrated in FIG. 7B, the heat sink plate 231 according to the second modification includes a solid structure made of a conductor such as copper, a metal other than copper, or graphite in a cross sectional view of the heat sink plate 231 taken along the line VIIB-VIIB in FIG. 7A. In other words, the fluid is not sealed inside the heat sink plate 231 according to the second modification. As described above, in the semiconductor module 10 according to the present embodiment, each of the heat sink plates 31 to 36 has a rectangular outer shape. It is possible to enhance the cooling performance and reduce the impedance by respectively disposing the terminals 40, 42, 44, 46, 48 in the lateral direction of the heat sink plates 31 to 36. However, even if the heat sink plate 231 illustrated in FIGS. 7A, 7B is adopted, the identical advantageous effect can be attained.

Figure 8:
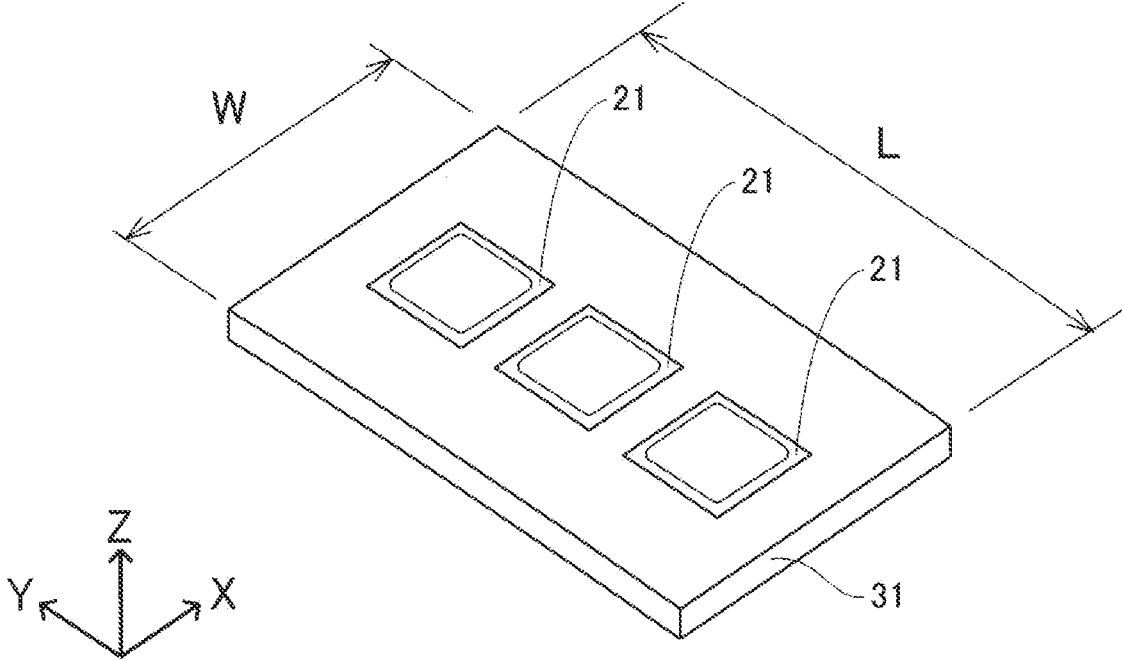
FIG. 8 illustrates an example of disposing multiple semiconductor elements at a single heat sink plate.

In the semiconductor module 10 according to the present embodiment, single semiconductor elements 21 to 26 are respectively disposed at the corresponding heat sink plates 31 to 36. On the other hand, as illustrated in FIG. 8, multiple first semiconductor elements 21 are disposed at the first heat sink plate 31. In this case, multiple first semiconductor elements 21 may be arranged along the longitudinal direction of each of the heat sink plates 31 to 36. With such an arrangement, it is possible to suppress the difference in the current paths generated among the multiple first semiconductor elements 21, and it is possible to achieve the uniformness of the currents respectively flowing through the multiple semiconductor elements 21. Similarly, the multiple semiconductor elements 21 to 26 may also be arranged at the other heat sink plates 32 to 36.

Although specific examples of the techniques disclosed in the present description have been described in detail above, these are merely examples and do not limit the scope of the present description. The techniques described in the present description include various modifications and modifications of the specific examples illustrated above. The technical elements described in the present description or the drawings exhibit technical usefulness alone or in various combinations, and are not limited to the combinations described in the present description at the time of filing. The techniques illustrated in the present description or drawings can achieve multiple objectives at the same time, and achieving one of the objectives itself has technical usefulness.

What is claimed is:

1. A semiconductor module comprising:
a substrate included in a circuit board;
a plurality of semiconductor elements configured to be disposed inside the substrate;
a plurality of heat sink plates disposed inside the substrate; and
a plurality of terminals, wherein
each terminal of the plurality of terminals is configured to be exposed to a surface of the substrate,
each terminal of the plurality of terminals is configured to be electrically connected to a corresponding semiconductor element of the plurality of semiconductor elements inside the substrate,
a fluid is sealed inside the plurality of heat sink plates,
the plurality of semiconductor elements is in direct contact with the plurality of heat sink plates,
at least one terminal of the plurality of terminals is electrically connected to at least one semiconductor element of the plurality of semiconductor elements via at least one heat sink plate of the plurality of heat sink plates,
a plurality of spaces are located within an interior of each heat sink plate of the plurality of heat sink plates,
each of the plurality of spaces extends in a longitudinal direction of the plurality of heat sink plates,
the fluid is sealed within each of the plurality of spaces, and
the plurality of spaces are isolated from each other.
2. The semiconductor module according to claim 1, wherein each heat sink plate of the plurality of heat sink plates is made of a metal.
3. The semiconductor module according to claim 1, further comprising:
a control circuit configured to be disposed at a surface of the substrate, and further configured to control an operation of each semiconductor element of the plurality of semiconductor elements.
4. The semiconductor module according to claim 1, wherein
an electrode of each semiconductor element of the plurality of semiconductor elements is electrically connected to a corresponding heat sink plate of the plurality of heat sink plates.
5. The semiconductor module according to claim 1, wherein
each heat sink plate of the plurality of heat sink plates has a rectangular outer shape, and
the plurality of terminals face the plurality of heat sink plates in a direction of a shortest side of the rectangular outer shape of the plurality of heat sink plates.
6. The semiconductor module according to claim 1, wherein
the plurality of semiconductor elements is in direct contact with the plurality of heat sink plates, respectively.
7. The semiconductor module according to claim 1, wherein
each semiconductor element of the plurality of semiconductor elements is in direct contact with a single heat sink plate of the plurality of heat sink plates, and each heat sink plate of the plurality of heat sink plates is in direct contact with a single semiconductor element of the plurality of semiconductor elements.

8. The semiconductor module according to claim 1, wherein the plurality of semiconductor elements are each in direct contact with at least one heat sink plate of the plurality of heat sink plates and are respectively arranged at equal intervals on the at least one heat sink plate of the plurality of heat sink plates.

9. The semiconductor module according to claim 1, wherein each heat sink plate of the plurality of heat sink plates has an anisotropic thermal conductivity in a plan view of the plurality of heat sink plates.

10. The semiconductor module according to claim 9, wherein each heat sink plate of the plurality of heat sink plates has a rectangular outer shape, wherein the anisotropic thermal conductivity includes at least a first thermal conductivity in a longitudinal direction of the plurality of heat sink plates and a second thermal conductivity in a lateral direction of the plurality of heat sink plates, and wherein the first thermal conductivity is larger than the second thermal conductivity.

11. The semiconductor module according to claim 10, wherein each terminal of the plurality of terminals is further configured to be disposed to face a corresponding heat sink plate of the plurality of heat sink plates in the lateral direction of the plurality of heat sink plates.

12. A semiconductor module comprising:

a substrate included in a circuit board;

a semiconductor element configured to be disposed inside the substrate; and a heat sink plate disposed inside the substrate, wherein a fluid is sealed inside the heat sink plate, the semiconductor element is in direct contact with the heat sink plate, a space is located within an interior of the heat sink plate, the fluid is sealed within the space, and an inner wall of the space has a plurality of protruding portions extending radially from a center of the heat sink plate.

13. A semiconductor module comprising:

a substrate included in a circuit board;

a semiconductor element configured to be disposed inside the substrate; and a heat sink plate disposed inside the substrate, wherein a plurality of spaces are located within an interior of the heat sink plate, each of the plurality of spaces extends in a longitudinal direction of the heat sink plate, a fluid is sealed within each of the plurality of spaces, and the plurality of spaces are isolated from each other.

* * * * *